United States Patent [19]

Borodovsky et al.

[11] Patent Number: 5,840,448
[45] Date of Patent: Nov. 24, 1998

[54] PHASE SHIFTING MASK HAVING A PHASE SHIFT THAT MINIMIZES CRITICAL DIMENSION SENSITIVITY TO MANUFACTURING AND PROCESS VARIANCE

[75] Inventors: Yan Borodovsky, Portland; Vivek Singh, Beaverton, both of Oreg.

[73] Assignee: Intel Corporation, Santa Clara, Calif.

[21] Appl. No.: 777,599

[22] Filed: Dec. 31, 1996

[51] Int. Cl.⁶ .................................................. G03F 9/00
[52] U.S. Cl. ............................................................. 430/5
[58] Field of Search .............................. 430/5, 322, 323, 430/324

[56] References Cited

U.S. PATENT DOCUMENTS

| | | | |
|---|---|---|---|
| 5,229,255 | 7/1993 | White | 430/5 |
| 5,308,722 | 5/1994 | Nistler | 430/5 |
| 5,543,254 | 8/1996 | Kim et al. | 430/5 |

*Primary Examiner*—S. Rosasco
*Attorney, Agent, or Firm*—Blakely, Sokoloff, Taylor & Zafman

[57] ABSTRACT

A reticle having only one phase delay value for a given wavelength of incident radiation. The reticle includes a first and second region, both transparent to incident radiation. The second region being adjacent to said first region. The incident radiation transmitted by the second region has a phase delay of other than an integer multiple of 90 degrees relative to said incident radiation transmitted by the first region.

17 Claims, 7 Drawing Sheets

PHASE SHIFTING MASK HAVING A PHASE SHIFT THAT MINIMIZES CRITICAL DIMENSION SENSITIVITY TO MANUFACTURING AND PROCESS VARIANCE

BACKGROUND OF THE INVENTION

1. Field of the Invention

The present invention relates to the field of defining lithographic patterns in the thin films or on a bulk substrate; more particularly, the present invention relates to a method and apparatus for using a mask (reticle) having a region with a phase shift element to define (print) a lithographic pattern used in the formation of a semiconductor device.

2. Description of Related Art

Within the semiconductor industry, lithographic exposure tools such as steppers and scanners have been used to define patterns in photosensitive media known as photoresist. After photoresist is spun onto a substrate, an exposure tool repeatedly projects an image of the pattern that is defined on the mask (also known as a reticle) to repeatedly expose the photoresist. The properties of the exposed portions of the photoresist are altered for subsequent processing steps such as resist development and consecutive substrate etching or implantation.

A mask is typically a transparent plate such as fused silica with opaque (chrome) elements on the plate used to define a pattern. A radiation source illuminates the mask according to well-known methods. The radiation transmitted through the mask and exposure tool projection optics forms a diffraction limited latent image of the mask features on the photoresist. Further discussion of patterning principles and diffraction limited microlithography can be found on pages 274–276 of *VLSI Technology* edited by S. M. Sze (©1983).

As feature sizes decrease, semiconductor devices are typically less expensive to manufacture and have higher performance. In order to produce smaller feature sizes, an exposure tool having adequate resolution and depth of focus at least as deep as the thickness of the photoresist layer is desired. For exposure tools that use conventional or oblique illumination, better resolution can be achieved by lowering the wavelength of the exposing radiation or by increasing the numerical aperture of the exposure tool, but the smaller resolution gained by increasing the numerical aperture is typically at the expense of a decrease in the depth of focus for minimally resolved features. This constraint presents a difficult problem in reducing the patterning resolution for a given radiation wavelength.

One method of printing smaller features with smaller critical dimensions while maintaining a sufficient depth of focus involves the use of phase-shifting masks (PSMs). PSMs use phase shift elements which shift the phase of the incident radiation to transmit radiation 180 degrees out of phase compared to radiation transmitted by adjacent mask elements. The radiation transmitted by the phase shift elements destructively interferes with radiation transmitted by adjacent mask elements in the areas of the image plane most susceptible to depth of focus limitations.

One example of a critical dimension (CD) is the physical width of the gate of a metal oxide semiconductor (MOS) transistor which is primarily determined by the width of a polysilicon line formed by a lithographic printing step and a subsequent polysilicon etch process. Because smaller gate dimensions are necessary for higher transistor performance, higher chip density, and lower device cost, it is desirable to produce smaller CDs.

As the nominal minimum feature sizes continue to decrease, control of the variability of these feature sizes becomes more critical. For example, the sensitivity of given CDs of patterned features to exposure tool and mask manufacturing imperfections as well as resist and thin films process variability is becoming more significant, particularly for features patterned with PSMs. In order to continue to develop manufacturable processes in light of the limited ability to reduce the variability of exposure tool and mask manufacturing parameters, it is desirable to reduce the sensitivity of CDs of patterned features to these parameters.

What is needed is a method to reduce the sensitivity of patterned feature CDs to tools and masks manufacturing imperfections and semiconductor process variations especially at the minimum feature size.

SUMMARY OF THE INVENTION

A reticle having only one phase delay value for a given wavelength of incident radiation is described. The reticle includes a first and second region, both transparent to incident radiation. The second region being adjacent to said first region. The incident radiation transmitted by the second region has a phase delay of other than an integer multiple of 90 degrees relative to said incident radiation transmitted by the first region.

BRIEF DESCRIPTION OF THE DRAWINGS

FIG. 2b illustrates the radiation intensity profile of the rim PSM of FIG. 2a.

FIG. 3b illustrates the radiation intensity profile of the Levenson PSM of FIG. 3a.

FIG. 4b illustrates the radiation intensity profile of the chromeless PSM of FIG. 4a.

FIG. 5b illustrates the radiation intensity profile of the sub-resolution PSM of FIG. 5a.

DETAILED DESCRIPTION

The present invention provides a phase shifting mask (PSM) having a phase shift element that introduces a propagation delay to incident radiation such that the radiation transmitted by the phase shift element located in one region of the PSM is out of phase with the radiation transmitted by the adjacent region by a value other than 180 degrees such that the critical dimensions (CDs) are least sensitive to manufacturing and process variations within the range of acceptable CD values. Theoretically, in a perfect imaging system, the critical dimensions (CDs) are least sensitive to manufacturing and process variations within the range of acceptable CD values when using 180 degree phase differences between adjacent regions of the reticle. However, in the presence of imperfect illumination, aberrations in projection optics, and mask making imperfections, the variance of CDs of patterned features is reduced by selecting a non-180 degree phase shift (phase delay).

Modeling and/or optimization algorithms may be applied to particular manufacturing and processing models to determine the optimal non-180 degree phase shift value. In one embodiment, a phase shift of approximately 166 degrees is optimal. In other embodiments, a phase shift in the approximate range of 135 to 225 degrees is optimal. Other phase shift values may be optimal depending on the characteristics of the lithographic patterning process.

Contrast is defined as the difference between the highest intensity and the lowest intensity divided by the sum of the highest intensity and the lowest intensity. Contrast is measured along a focal plane of a projection system of an exposure tool. The focal plane is typically within a photoresist layer overlying a substrate such as a wafer at a depth typically determined according to well-known experimental means. Contrast is maximized at the optimal non-180 degree phase shift value. In addition, the average contrast is maximized across a distribution of manufacturing and process parameters when the nominal phase shift value is the optimal non-180 degree phase shift value.

Figure 1:
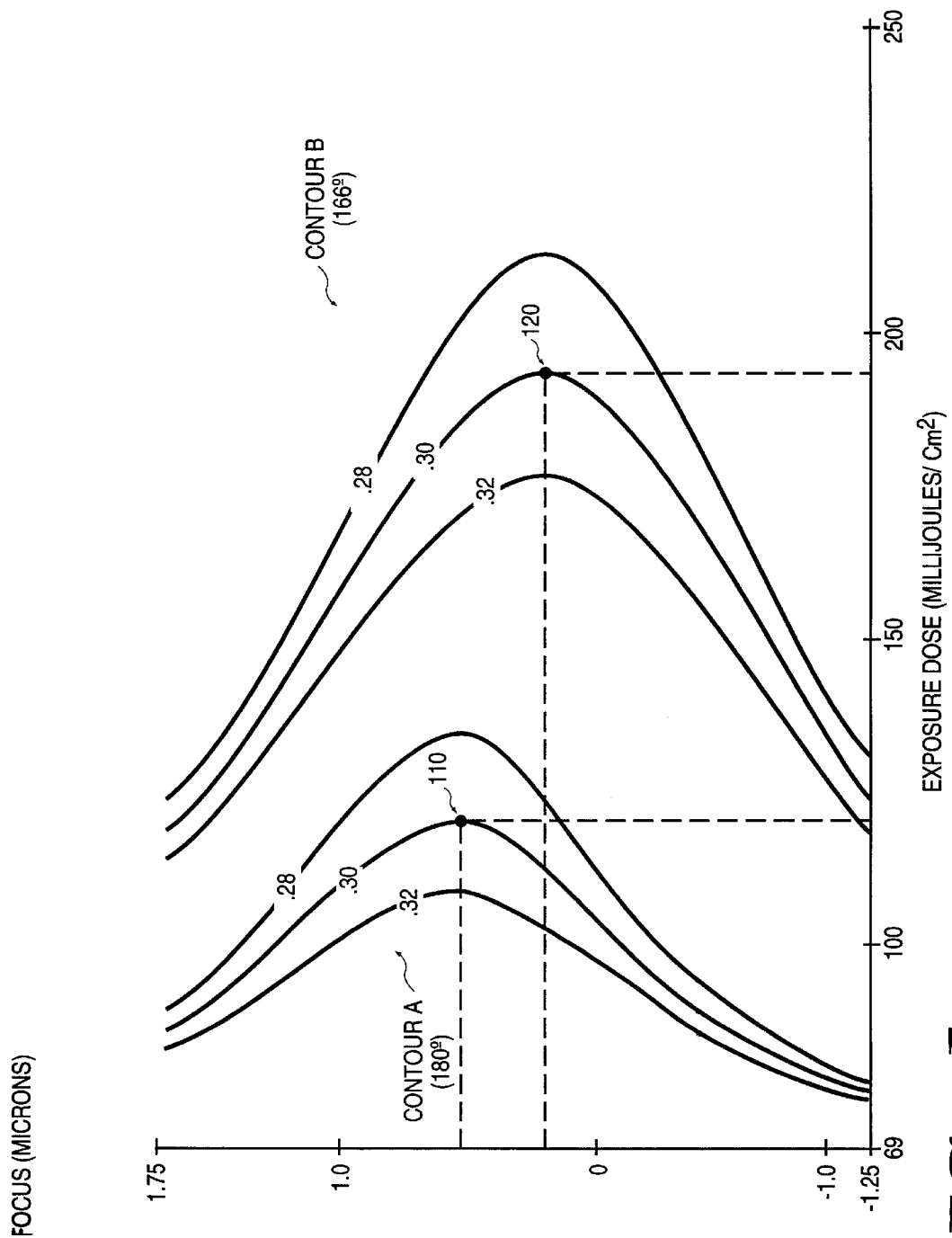
FIG. 1 illustrates a comparative contour plot of patterned line CD as a function of focus and exposure for rim PSM masks with phase shifts of 180 and 166 degrees.

FIG. 1 illustrates a comparative contour plot of CD as a function of focus and exposure errors (focus and exposure latitude) for a lithographic patterning process using a rim PSM with a phase-shift of approximately 180 degrees (contour A) and a lithographic patterning process using a rim PSM with a phase-shift of approximately 166 degrees (contour B).

Focus is represented on the y-axis in microns and exposure dose is represented on the x-axis in millijoules per centimeter squared (mj/cm$^2$). Focus indicates the depth of the focal plane beneath the surface of the photoresist layer. The combinations of focus and exposure dose that produce a particular CD is represented as a contour curve for each value of phase shift. The CD is the post-development width of a nominally 300 nanometer (nm) line formed by a lithographic patterning process in commercially available resist using an exposure tool with 365 nm exposure wavelength radiation, a magnification ratio of 5:1, a numerical aperture equal to 0.45, and a partial coherence of 0.69. The deviation from the nominal value of phase shift due to reticle manufacturing errors is limited to 5 degrees. The width of the phase shift elements have a tolerance of 20 nanometers (nm). The exposure tool focusing tolerance is 70 nm from the nominal focus value. Exposure dose tolerance is ±6% of the nominal exposure dose.

Contour plot A and contour plot B show the focus and exposure latitude for a feature (line) in the resist with CD between 0.28 microns and 0.32 microns for their corresponding lithographic patterning process. A nominal operating point 110 for contour A and a nominal operating point 120 for contour B are typically selected to provide the greatest latitude in both focus and exposure dose. The increased area between the extremities of contour plot B as compared to contour plot A indicate that there is more focus and exposure latitude for contour plot B for a fixed range of CDs. Thus, greater deviations from the nominal focus (focus error) and greater deviations from the nominal exposure dose (exposure dose error) may be tolerated using a phase shift of approximately 166 degrees as compared to a phase shift of approximately 180 degrees while still producing a CD within the desired range. Alternatively, for a fixed range of focus and exposure, the corresponding range of CDs will be narrower for the process corresponding to contour plot B as compared to contour plot A.

Thus, the focus and exposure latitude for the lithographic patterning process using a PSM with a phase-shift of approximately 166 degrees is improved such that it provides a tighter distribution of CDs for a given distribution of focus and exposure or provides a fixed distribution of CDs with more latitude for focus and exposure variation.

It will be apparent to one skilled in the art that the present invention may be applied to numerous configurations of PSMs. The following four examples are only meant for illustration and should not be interpreted to limit the application of the present invention to these types of PSMs.

Figure 2A:
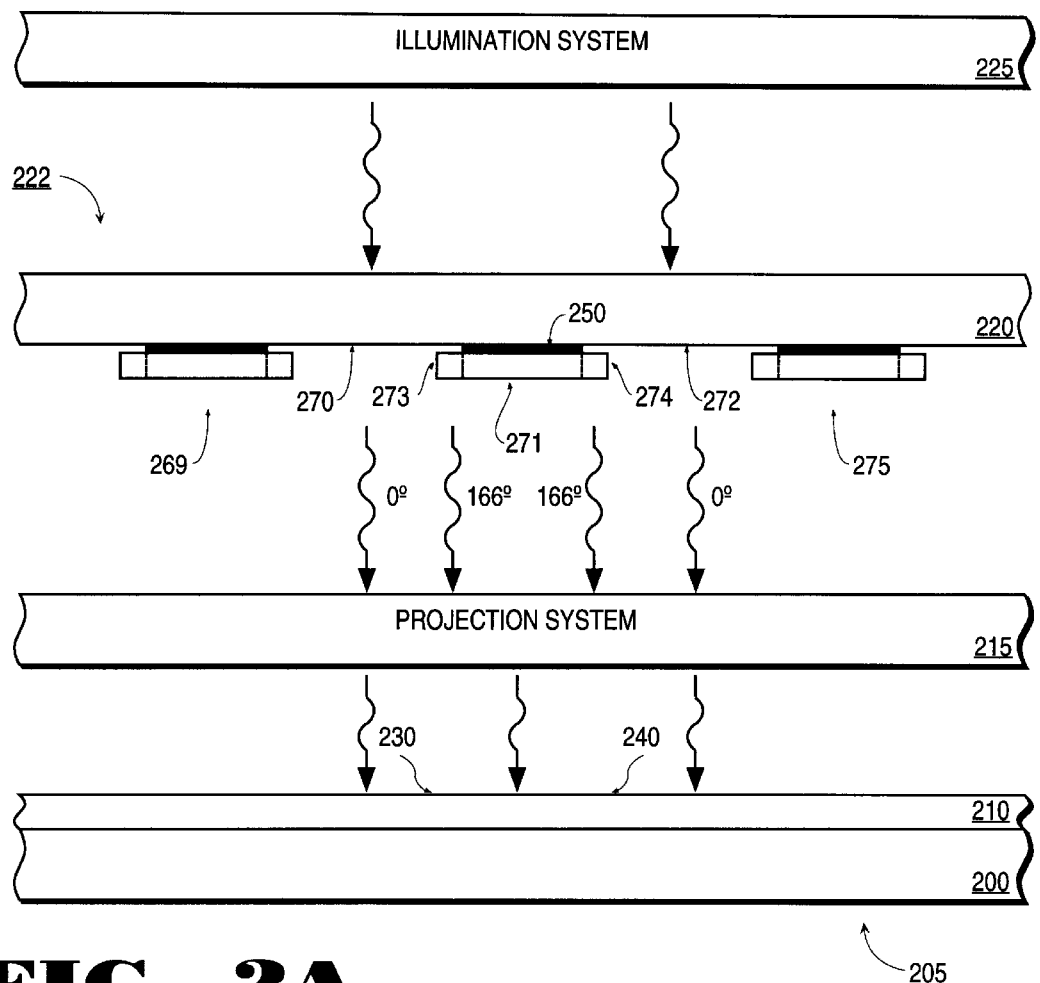
FIG. 2a illustrates one embodiment of a rim phase-shifting mask (PSM).

FIG. 2a illustrates one embodiment of an exposure tool including an illumination system 225, a rim PSM 222 having a plurality of rim elements, a projection system 215, and a wafer 205 having a substrate 200 and a photosensitive layer 210. Each rim element includes a phase shift element overlaying a chrome element such that the phase shift element overhangs each edge of the chrome element. The regions of the phase shift element that overhangs the chrome elements are referred to herein as phase shift regions.

Figure 2B:
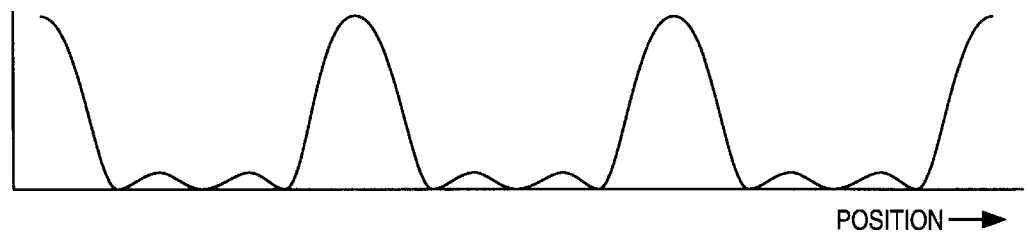

The illumination system 225 exposes the rim PSM 222 with radiation. The rim PSM 222 transmits and modulated the incident radiation to expose the projection system 215. The projection system 215 transmits the radiation transmitted and modulated by the rim PSM 222 to expose the photosensitive layer 210 overlying the substrate 200 of the wafer 205. FIG. 2b shows a plot of radiation intensity (I) along the focal plane of the projection system 215 as a function of the lateral position along the focal plane (radiation intensity profile).

The rim PSM 222 includes a transparent plate 220 having a first region 270 between a rim element 269 and a chrome element 250 coupled to a phase shift element 271 (the chrome element 250 and the phase shift element 271 being referred to as the center rim element), and a second region 272 between the center rim element and a rim element 275. The phase shift element 271 having a first phase shift region 273 and a second phase shift region 274. The first region 270, the second region 272, the first phase shift region 273, and the second phase shift region 274 are all substantially transparent to the incident radiation. The incident radiation is transmitted through the first phase shift region 273, and the second phase shift region 274 such that this transmitted radiation is approximately 166 degrees out of phase with the radiation transmitted by the first region 270 and the second region 272. The chrome element 250 is substantially opaque to the incident radiation.

A first surface area 230 and a second surface area 240 of the photosensitive layer 210 are substantially unexposed due to the destructive interference (partial) between the transmitted radiation diffracted by the edges of the chrome element 250 (and the corresponding chrome elements of adjacent rim elements) and the transmitted radiation (approximately 166 degrees out of phase) diffracted by the edges of the first phase shift region 273 and the second phase shift region 274 (and the corresponding phase shift elements of adjacent rim elements). A rim PSM generally achieves a higher modulation in the radiation intensity distribution at the mask image plane (contrast) between the areas underlying the opaque and transmitting regions of the rim PSM as compared to a non-PSM. The phase shift of the non-180 degree PSM is selected to provide sufficient contrast in the radiation intensity (within the photoresist layer 210) to pattern the photosensitive layer 210 such that subsequent processing according to well-known methods will generate features having a nominal CD value that is within an acceptable range of the target value with minimal CD sensitivity to manufacturing and process variations.

In an alternative embodiment, the phase shift elements are located above the transparent plate 220. In one embodiment, portions of the transparent plate 220 are etched to a particular depth and width to substitute for each phase shift element. The reduced thickness of these phase shift regions shortens the propagation delay of radiation transmitted through these phase shift regions relative to the adjacent regions to produce the desired phase shift.

Figure 3A:
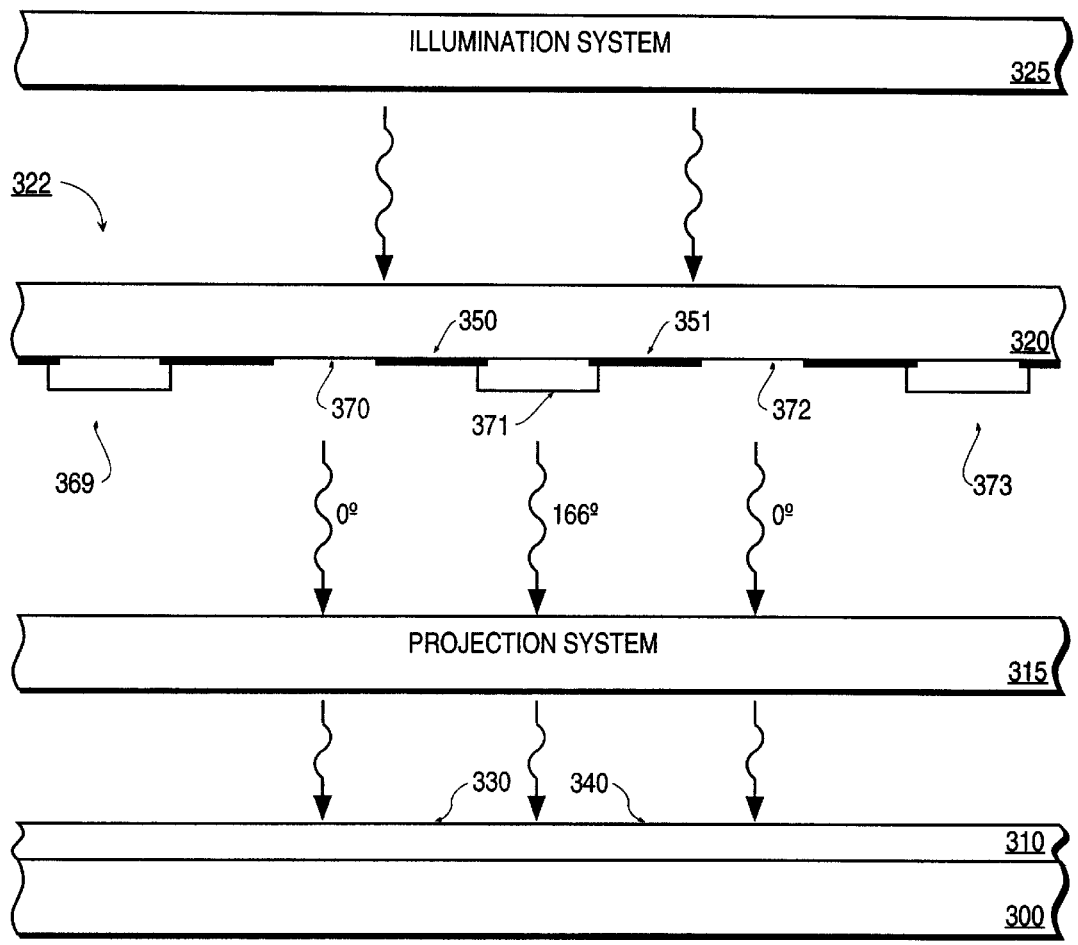
FIG. 3a illustrates one embodiment of a Levenson PSM.

FIG. 3a illustrates one embodiment of an exposure tool including an illumination system 325, a Levenson PSM 322 having a plurality of Levenson elements, a projection system 315, and a wafer 305 having a substrate 300 and a photosensitive layer 310. Each Levenson element includes a phase shift element positioned between chrome elements.

Figure 3B:
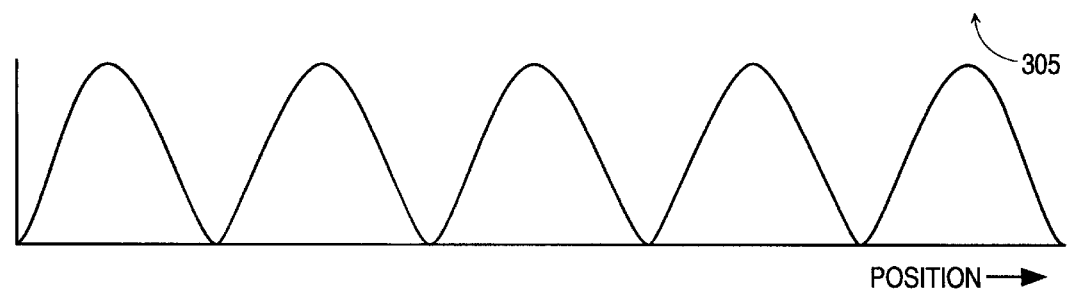

The illumination system 325 exposes the Levenson PSM 322 with radiation. The Levenson PSM 322 transmits and modulated the incident radiation to expose the projection system 315. The projection system 315 transmits the radiation transmitted and modulated by the Levenson PSM 322 to expose the photosensitive layer 310 overlying the substrate 300 of the wafer 305. FIG. 3b shows a plot of radiation intensity (I) along the focal plane of the projection system 315 as a function of the lateral position along the focal plane (radiation intensity profile).

The Levenson PSM 322 includes a transparent plate 320 having a first region 370 between a Levenson element 369 (a portion not shown) and a phase shift element 371 centered between a chrome element 350 and a chrome element 351 (the center Levenson element), and a second region 372 between the center Levenson element and a Levenson element 373 (a portion not shown).

The first region 370, the second region 372, and the phase shift region 371 are all substantially transparent to the incident radiation. The incident radiation is transmitted through the phase shift region 371 such that this transmitted radiation is approximately 166 degrees out of phase with the radiation transmitted by the first region 370 and the second region 372. The chrome element 350 and the chrome element 351 are substantially opaque to the incident radiation.

A first surface area 330 and a second surface area 340 of the photosensitive layer 310 are substantially unexposed due to the destructive interference (partial) between the transmitted radiation diffracted by the edges of the chrome element 350 and the chrome element 351 (and the corresponding chrome elements of adjacent Levenson elements) and the transmitted radiation (approximately 166 degrees out of phase) diffracted by the edges of the phase shift region 371 (and the corresponding phase shift elements of adjacent Levenson elements). A Levenson PSM generally achieves a sharper edge profile (contrast) between the areas underlying the opaque and transmitting regions of the Levenson PSM. The phase shift of the non-180 degree PSM is selected to provide sufficient contrast in the radiation intensity profile (within the photoresist layer 210) to pattern the photosensitive layer 310 such that subsequent processing according to well-known methods will generate features having a nominal CD value that is within an acceptable range of the target value with minimal CD sensitivity to manufacturing and process variations.

Figure 4A:
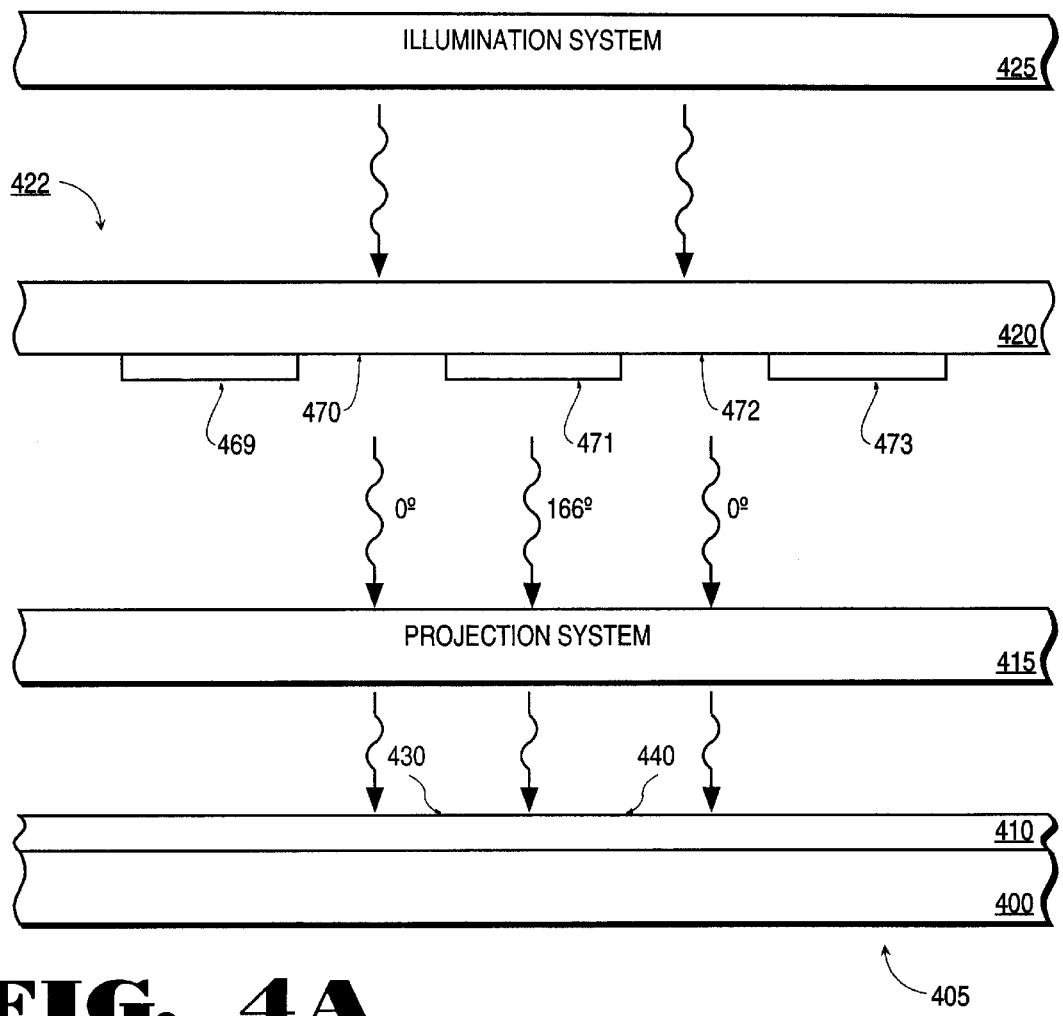
FIG. 4a illustrates one embodiment of a chromeless PSM.

FIG. 4a illustrates one embodiment of an exposure tool including an illumination system 425, a chromeless PSM 422 having a plurality of phase shift elements, a projection system 415, and a wafer 405 comprising a substrate 400 and a photosensitive layer 410.

Figure 4B:
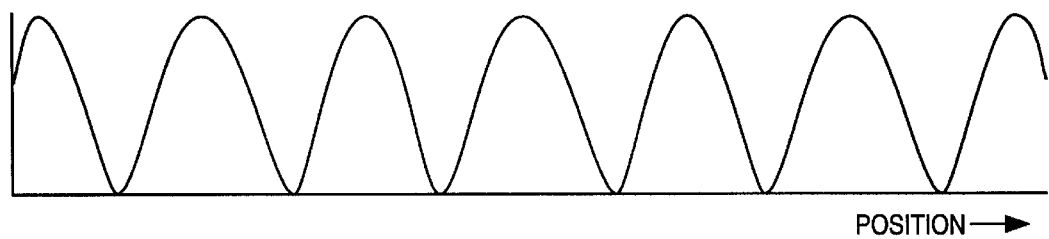

The illumination system 425 exposes the chromeless PSM 322 with radiation. The chromeless PSM 422 transmits and modulate the incident radiation to expose the projection system 415. The projection system transmits the radiation transmitted and modulated by the chromeless PSM 322 to expose the photosensitive layer 210 overlying the substrate 200 of the wafer 205. FIG. 4b shows a plot of radiation intensity (I) at the focal plane of the projection system 415 as a function of the lateral position along the focal plane (radiation intensity profile).

The chromeless PSM 422 includes a first region 470 between a first phase shift element 469 and a center phase shift element 471, a second region 472 between the center phase shift element 471 and a third phase shift element 473. The first region 470, the second region 472, and the center phase shift element 471 are substantially transparent to the incident radiation. The incident radiation is transmitted through the center phase shift element 471 such that this transmitted radiation is approximately 166 degrees out of phase with the radiation transmitted by the first region 470 and the second region 472.

A first surface area 430 and a second surface area 440 of the photosensitive layer 410 are substantially unexposed due to the destructive interference (partial) between the transmitted radiation diffracted by the edges of the first region 470 and the second region 472 (and the corresponding adjacent regions) and the transmitted radiation (approximately 166 degrees out of phase) diffracted by the edges of the center phase shift region 471 (and the corresponding adjacent phase shift elements). A chromeless PSM generally substitutes patterns of alternating phase-shift and non-phase shift regions for chrome regions according to well-known methods. The phase shift of the non-180 degree PSM is selected to provide sufficient contrast in the radiation intensity profile (within the photoresist layer 410) to provide the substantially unexposed regions such that subsequent processing according to well-known methods will generate features having a nominal CD value that is within an acceptable range of the target value with minimal CD sensitivity to manufacturing and process variations.

Figure 5A:
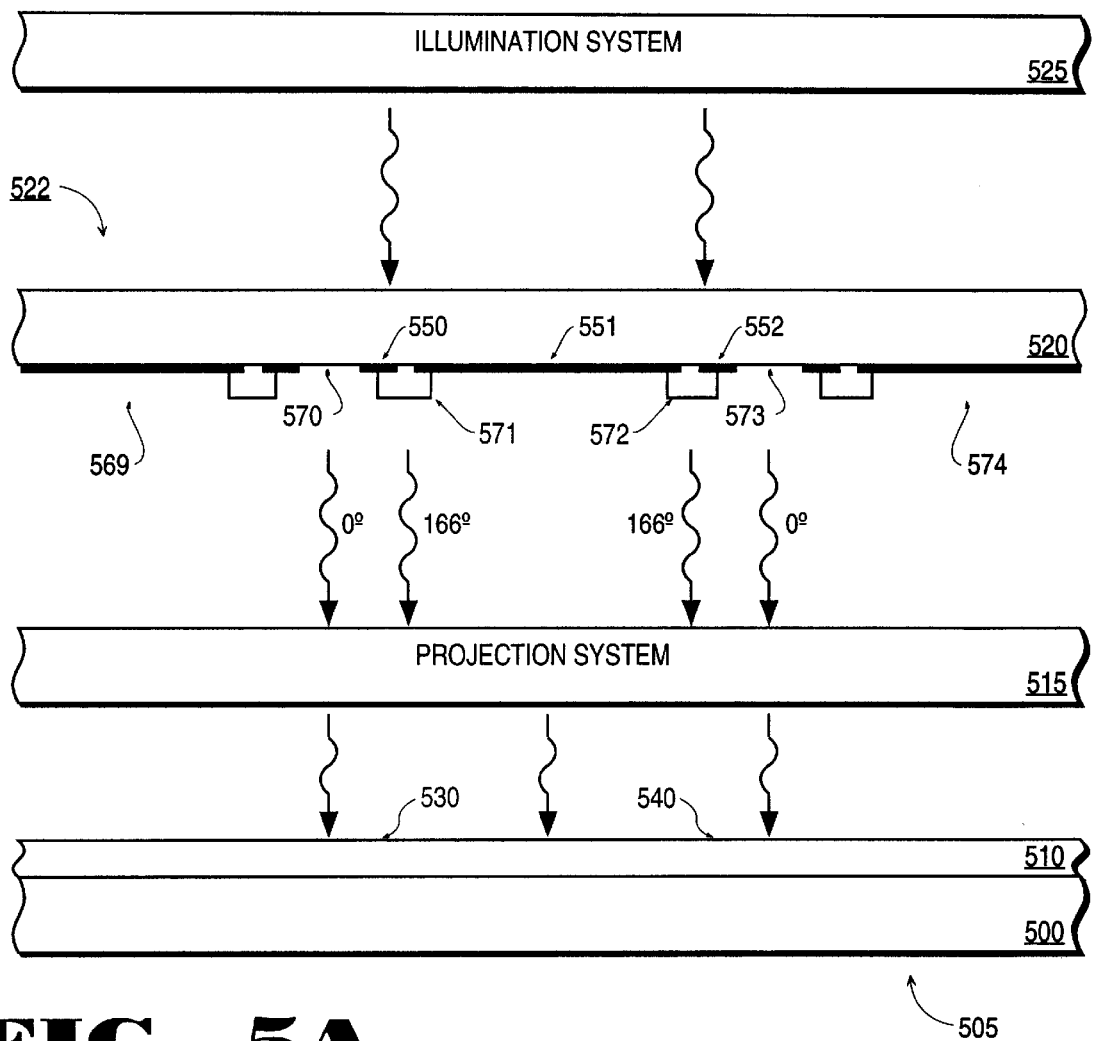
FIG. 5a illustrates one embodiment of a sub-resolution PSM.

FIG. 5a illustrates one embodiment of an exposure tool including an illumination system 525, a subresolution PSM 522 having a plurality of subresolution elements, a projection system 515, and a wafer 505 comprising a substrate 500 and a photosensitive layer 510. Each subresolution element includes a chrome element having a phase shift element and another chrome element at each end.

The illumination system 525 exposes the subresolution PSM 522 with radiation.

Figure 5B:
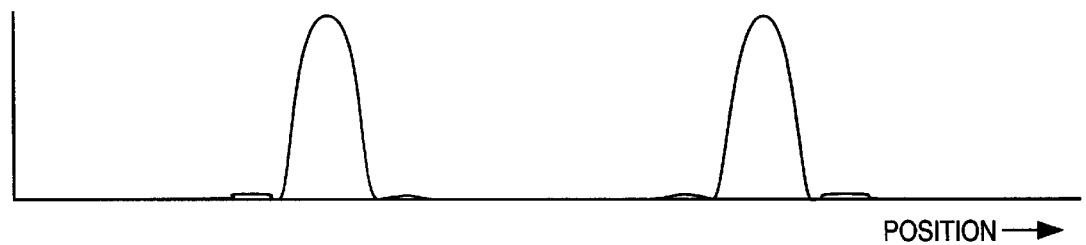

The subresolution PSM 522 transmits and modulate the incident radiation to expose the projection system 515. The projection system transmits the radiation transmitted by the subresolution PSM 522 to expose the photosensitive layer 510 overlying a substrate 500 of the wafer 505. FIG. 5b shows a plot of radiation intensity (I) at the focal point of the projection system 315 as a function of the lateral position along the focal plane (radiation intensity profile).

The subresolution PSM 522 includes a first region 570 between a subresolution element 569 (a portion not shown) and a chrome element 550, a first phase shift element 571, a chrome element 551, a second phase shift element 572, and a chrome element 552 (center subresolution element), and a second region 573 between the center subresolution element and a subresolution element 574 (a portion not shown).

The first region 570, the second region 573, the first phase shift element 571 and the second phase shift element 572 are substantially transparent to the incident radiation. The incident radiation is transmitted through the first phase shift element 571 and the second phase shift element 572 such that this transmitted radiation is approximately 166 degrees out of phase with the radiation transmitted by the first region 570 and the second region 573. The chrome element 550, the chrome element 551, and the chrome element 552 are substantially opaque to the incident radiation.

A first surface area 530 and a second surface area 540 of the photosensitive layer 510 are substantially unexposed due to the destructive interference (partial) between the transmitted radiation diffracted by the edges of the chrome element 550 and the chrome element 552 (and the corresponding chrome elements of adjacent subresolution elements) and the transmitted radiation (approximately 166 degrees out of phase) diffracted by the edges of the first phase shift element 571 and the second phase shift element 572 (and the corresponding phase shift elements of adjacent subresolution elements).

A subresolution PSM generally achieves a sharper edge profile (contrast) between the areas underlying the opaque and transmitting regions of the subresolution PSM. The phase shift of the non-180 degree PSM is selected to provide sufficient contrast in the radiation intensity profile (within the photoresist layer 510) to provide the substantially unexposed regions such that subsequent processing according to well-known methods will generate features having a nominal CD value that is within an acceptable range of the target value with minimal CD sensitivity to manufacturing and process variations.

Generally, PSMs have a single phase shift value corresponding to the relative phase shift between a phase shift element and another transparent region of the PSM. However, more phase shift values may be used. In one embodiment, the PSM has four transparent regions. Each pair of regions are out-of-phase by the optimal phase shift value determined according to the method described above. For example, the four regions may have phase shift values of 0 and 166, and 90 and 256 degrees, approximately.

Figure 6:
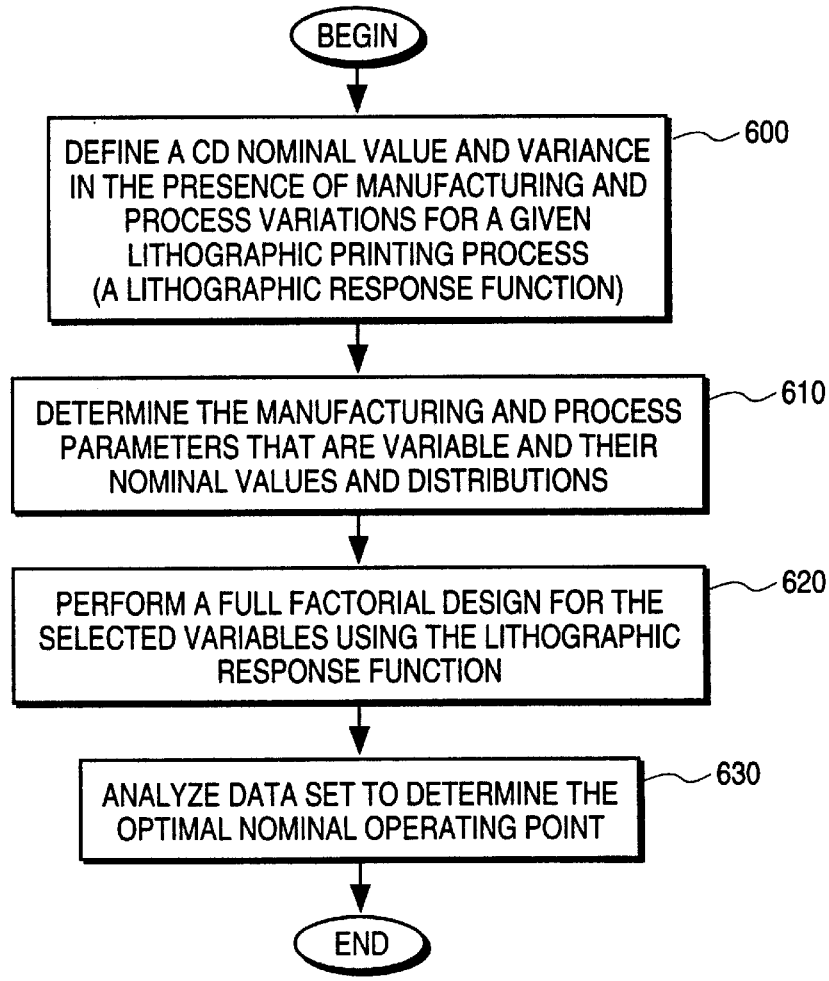
FIG. 6 illustrates one embodiment of a method of determining the optimal phase shift value.

FIG. 6 illustrates one embodiment of a method to determine the optimal value of the phase shift.

In step 600, a lithographic response function defining CD nominal value and variance in the presence of manufacturing and process variations is computed for a given lithographic patterning process. In one embodiment, commercial software may be used to compute the lithographic response function. It will be apparent to one skilled in the art that other parameters in addition to CD, e.g., resist wall slope, may be modeled by the lithographic response function.

In step 610, the manufacturing and process parameters, and their nominal values and distributions, are determined. In one embodiment, the parameters (variables) are the relative location of the resist surface to the focal plane of the exposure tool, the numerical apertures for the projection and illumination optics, the thickness of the resist and the underlying thin film, the feature size of opaque regions on the mask, the width and thickness of the phase-shift elements, the lateral area and thickness of the phase shift elements and opaque mask features, and the exposure dose.

In step 620, a full factorial design is generated for the selected variables using the lithographic response function and expected ranges of variable values. The lithographic response could be determined either experimentally or through a calibrated simulator.

In step 630, the data set is analyzed to determine the optimal nominal operating point. In one embodiment, this analysis is carried out in three steps. First, a subset of the data set is selected such that the subset only contains operating points for which the CD is within an acceptable range (e.g., 10%) of the target CD. Second, the variance as a function of the selected variables is computed for each point within the subset. Third, the point within the subset with the least variance is selected. The optimal phase shift value is the phase shift value for the point that has the least variance of all the points within an acceptable range of the target CD.

Figure 7:
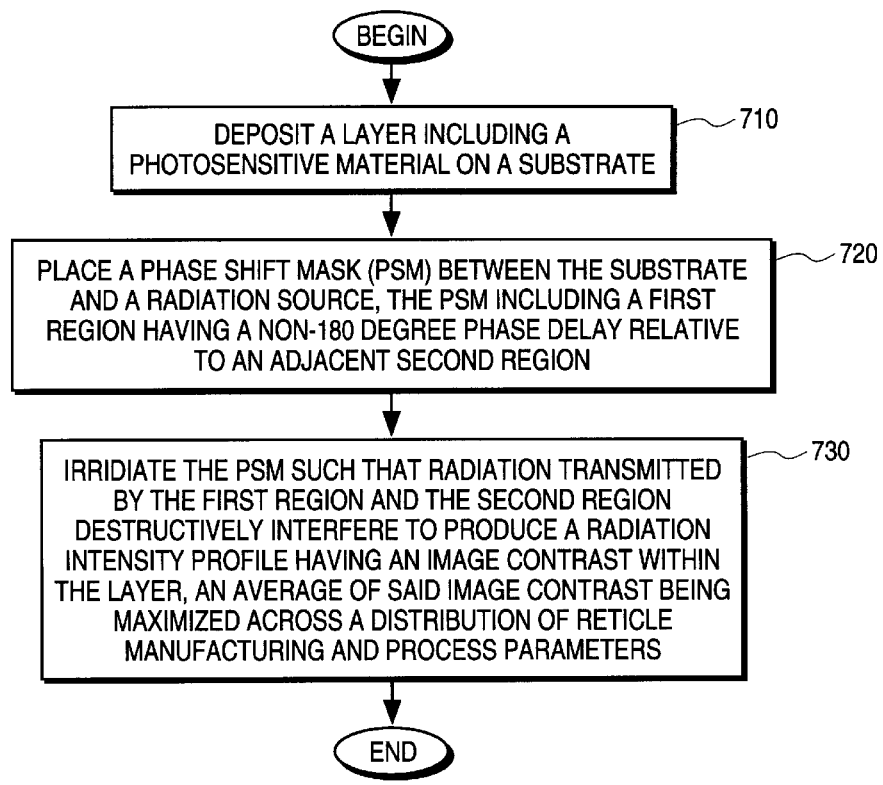
FIG. 7 illustrates one embodiment of a method of forming a patterned layer using a PSM of the present invention.

FIG. 7 illustrates one embodiment of the method of forming a patterned layer using a PSM of the present invention.

In step 710, a layer including a photosensitive material such as photoresist is deposited on a substrate such as a wafer.

In step 720, a PSM is placed between the substrate and a radiation source, the PSM including a first region having a non-180 degree phase shift relative to an adjacent second region. In one embodiment, the PSM has a single phase shift.

In another embodiment, the PSM has more than one phase shift. For example, the PSM may have four transparent regions. Each pair of regions are out-of-phase by the optimal phase shift value determined according to the method described above. For example, the four regions may have phase shift values of 0 and 166, and 90 and 256 degrees, approximately. In one embodiment, each of two regions adjacent to a third region is out of phase with the third region by a non-180 degree phase delay. In another embodiment, two regions out of phase with each other by 166 degrees are adjacent to an opaque element, such as chrome.

In one embodiment, the PSM is one of the configurations illustrated above. However, it will be apparent to one skilled in the art that the method of the present invention may be applied to numerous configurations of PSMs.

In step 730, the PSM is irradiated such that radiation transmitted by the first region and the second region destructively interfere to produce a radiation intensity profile having an image contrast within the layer, an average of said image contrast being maximized across a distribution of reticle manufacturing and process parameters. Furthermore, the average contrast is maximized across a distribution of manufacturing and process parameters when the nominal phase shift value is the optimal non-180 degree phase shift value.

The method of patterning to take advantage of PSM principles is well-known in the art. Furthermore, the method of making a mask having arbitrary phase shift values would be apparent to one skilled in the art. In one embodiment, the method of making a PSM having an arbitrary phase shift value involves varying the thickness of the phase shift elements to correspond to the phase-shift desired.

Thus, the present invention provides a PSM having a phase shift element that shifts the phase of the incident radiation such that the radiation transmitted by the phase shift element is out of phase with the radiation transmitted by the adjacent region by a value other than 180 degrees such that the critical dimensions (CDs) are least sensitive to manufacturing and process variations within the range of acceptable CD values. Furthermore, the average contrast is maximized across a distribution of manufacturing and process parameters when the nominal phase shift value is the optimal non-180 degree phase shift value.

What is claimed is:

1. A reticle having only one phase delay for transmitting incident radiation, said reticle comprising:

a first region being transparent to said incident radiation;

a second region being transparent to said incident radiation, said second region being adjacent to said first region, said incident radiation transmitted by said second region having said phase delay of other than an integer multiple of 90 degrees relative to said incident radiation transmitted by said first region.

2. The reticle of claim 1 wherein said phase delay is approximately between 135 degrees and 225 degrees.

3. The reticle of claim 2 wherein said phase delay is approximately 166 degrees.

4. The reticle of claim 1 further comprising a chrome element, said chrome element being positioned between said first region and said second region.

5. The reticle of claim 1 wherein said first region adjoins said second region.

6. A method of forming a patterned layer on a substrate comprising the steps of:

depositing a layer including a photosensitive material on said substrate;

placing a reticle between said substrate and a radiation source, said reticle having only one phase delay, said reticle comprising:

a first region being transparent to said incident radiation;

a second region being transparent to said incident radiation, said second region being adjacent to said first region, said incident radiation transmitted by said second region having said phase delay of other than an integer multiple of 90 degrees relative to said incident radiation transmitted by said first region; and irradiating said reticle such that radiation transmitted by said first region and said second region destructively interfere to produce a radiation intensity profile within said layer.

7. The method of claim 6 wherein said radiation intensity profile has an image contrast, an average of said image contrast being maximized across the distribution of reticle manufacturing and process parameters.

8. A reticle comprising:

a first region having a first phase delay;

a second region having a second phase delay; and a third region having a third phase delay, said third region being adjacent to said second region, said second phase delay being other than the median of said first phase delay and said third phase delay, said first phase delay and said third phase delay having different values.

9. The reticle of claim 8 wherein said second phase delay is approximately between 135 degrees and 225 degrees out of phase with said first phase delay.

10. The reticle of claim 9 wherein said second phase delay is approximately 166 degrees out of phase with said first phase delay.

11. A method of forming a patterned layer on a substrate comprising the steps of:

depositing a layer including a photosensitive material on said substrate;

placing a reticle between said substrate and a radiation source, said reticle comprising:

a first region having a first phase delay;

a second region having a second phase delay, said second region being adjacent to said first region; and a third region having a third phase delay, said third region being adjacent to said second region, said second phase delay being other than the median of said first phase delay and said third phase delay, said first phase delay and said third phase delay having different values; and irradiating said reticle such that radiation transmitted by said first region and said second region destructively interfere to produce a radiation intensity profile within said layer.

12. The method of claim 11 wherein said radiation intensity profile has an image contrast, an average of said image contrast being maximized across the distribution of reticle manufacturing and process parameters.

13. A reticle comprising:

a first region having a first phase delay;

a second region having a second phase delay, said second region being adjacent to said first region, said second phase delay being other than an integer multiple of 90 degrees out of phase with said first phase delay; and a third region, said third region being adjacent to said second region, said third region being opaque.

14. The reticle of claim 13 wherein said second phase delay is approximately between 135 degrees and 225 degrees out of phase with said first phase delay.

15. The reticle of claim 14 wherein said second phase delay is approximately 166 degrees out of phase with said first phase delay.

16. A method of forming a patterned layer on a substrate comprising the steps of:

depositing a layer including a radiation sensitive material on said substrate;

placing a reticle between said substrate and a radiation source, said reticle comprising:

a first region having a first phase delay;

a second region having a second phase delay, said second region being adjacent to said first region, said second phase delay being other than an integer multiple of 90 degrees out of phase with said first phase delay; and a third region, said third region being adjacent to said second region, said third region being opaque; and irradiating said reticle such that radiation transmitted by said first region and said second region destructively interfere to produce a radiation intensity profile within said layer.

17. The method of claim 16 wherein said radiation intensity profile has an image contrast, an average of said image contrast being maximized across the distribution of reticle manufacturing and process parameters.

* * * * *